(12) United States Patent
Schmidhammer

(10) Patent No.: US 7,567,148 B2
(45) Date of Patent: Jul. 28, 2009

(54) FREQUENCY SHUNT

(75) Inventor: Edgar Schmidhammer, Stein (DE)

(73) Assignee: EPCOS AG, Munich (DE)

( * ) Notice: Subject to any disclaimer, the term of this patent is extended or adjusted under 35 U.S.C. 154(b) by 199 days.

(21) Appl. No.: 11/718,454

(22) PCT Filed: Oct. 7, 2005

(86) PCT No.: PCT/EP2005/010840

§ 371 (c)(1),
(2), (4) Date: Jul. 6, 2007

(87) PCT Pub. No.: WO2006/048096

PCT Pub. Date: May 11, 2006

(65) Prior Publication Data

US 2008/0136555 A1    Jun. 12, 2008

(30) Foreign Application Priority Data

Nov. 4, 2004    (DE) ........................ 10 2004 053 319

(51) Int. Cl.
*H03H 9/00* (2006.01)
*H03H 9/205* (2006.01)
(52) U.S. Cl. ..................... 333/133; 333/189
(58) Field of Classification Search .............. 333/133, 333/187, 188, 189, 190, 191, 192, 193, 194, 333/195, 196
See application file for complete search history.

(56) References Cited

U.S. PATENT DOCUMENTS

2007/0030096 A1*   2/2007   Nishihara et al. .......... 333/133

2008/0024243 A1*   1/2008   Iwaki et al. ................. 333/133

FOREIGN PATENT DOCUMENTS

| EP | 0 788 182 | 8/1997 |
| EP | 1 058 383 | 12/2000 |
| EP | 1 184 979 | 3/2002 |
| EP | 1 341 317 | 9/2003 |
| WO | WO2004/047290 | 6/2004 |

OTHER PUBLICATIONS

Written Opinion with English translation for PCT/EP2005/010840.
International Search Report for PCT/EP2005/010840.
EPCOS "ESD Protection and Filter in One" Press Release (Online) Aug. 2001, XP002361864 infoserv@scn.de.
Onzuka T. et al., "SAW Duplexers Without µ4 Phase Shifter for PDC Cellular Phone Systems" 2003 IEEE Electronics Symposium, p. 2101-2104, ISBN 0-7803-7922-5.

* cited by examiner

*Primary Examiner*—Dean O Takaoka
(74) *Attorney, Agent, or Firm*—Fish & Richardson P.C.

(57) ABSTRACT

A frequency separating unit includes an antenna unit, a first signal path, a second signal path, first band-pass filter in the first signal path, a second band-pass filter in the second signal path, and a matching circuit between the antenna unit and the second band-pass filter in the second signal path. The matching circuit includes a shunt arm to ground that includes a first impedance component, and a parallel circuit that includes an acoustic wave resonator and a second impedance component. The matching circuit is configured to operate as a phase shifter and to produce a substantially open circuit at an input of the second filter in a pass band of the first band-pass filter.

22 Claims, 3 Drawing Sheets

FREQUENCY SHUNT

TECHNICAL FIELD

This patent application describes a frequency separating unit, which can be used, e.g., in the front-end circuit of a portable mobile-radio device.

BACKGROUND

EP 1058383 A3 describes a frequency separating unit with thin-film resonators.

WO 2004/047290 A1 describes a front-end circuit with a frequency separating unit, in which a $\lambda/4$ line arranged in a receive path and connected before a band-pass filter is used as a phase shifter.

EP 0 788 182 A2 describes an MWK duplexer (MWK=microwave ceramic) with dielectric resonators, in which a 180° phase shifter has LC elements instead of a $\lambda/4$ line.

SUMMARY

Described herein is a frequency separating unit with a space-saving phase shifter and good isolation between different signal paths.

This patent application describes a frequency separating unit with an antenna terminal and two signal paths. In each signal path, a band-pass filter is arranged. In one of the signal paths (e.g., in the second signal path), a matching circuit that is suitable for use as a phase shifter is arranged between the antenna terminal and the band-pass filter. The matching circuit has a shunt arm to ground, in which a first impedance component is arranged. A parallel circuit comprised of an acoustic wave resonator and a second impedance component is arranged in the signal path in the matching circuit.

The acoustic wave resonator is, in one variant, a thin-film acoustic wave resonator. The acoustic wave resonator comprises, in another variant, at least one acoustic wave transducer.

The matching circuit functions essentially as a phase shifter, such as a 180° phase shifter, and generates, in the pass band of the other (first) signal path, an open end at the input of the filter connected after it, i.e., the second filter arranged in the second signal path.

In one embodiment, it is possible to arrange the matching circuit partially in the first and partially in the second signal path. The matching circuit can produce a phase shift of less than 180° (between the antenna terminal and the input of the second band-pass filter).

The embodiments described herein produce good isolation between signal paths and a space-saving construction of the phase shifter. One embodiment has a high ESD resistance because a portion of the energy can flow to ground via the shunt arm.

The frequency separating unit may be a duplexer. Here, the first signal path may be a transmit path and the second signal path may be a receive path. The frequency separating unit can be a diplexer, e.g., for separating the signals of two radio bands.

In the context of this application, an impedance component is understood to be an electrical component with complex impedance. The impedance component can represent a single circuit element, such as, e.g., an inductor, a capacitor, or a thin-film resonator, or a combination (series or parallel circuit) of these circuit elements. As an impedance component, e.g., an LC element constructed as a series resonance circuit or a parallel resonance circuit, can be used.

In the second signal path, in addition to the parallel circuit of the thin-film resonator and the second impedance component, other series impedance components can also be arranged, which may include inductors or capacitors. One series impedance component can be arranged, e.g., between the connection node of the shunt arm and the input of the second filter. Another series impedance component can be arranged, e.g., between the antenna terminal and the connection node of the shunt arm. The shunt arm can be connected directly to the antenna terminal.

It is advantageous if the parallel circuit of the thin-film resonator and the second impedance component or a circuit, which is composed of all of the components connected in series in the second signal path, has a resonance frequency that is in the pass range of the second filter.

The first impedance component arranged in the shunt arm can include a capacitor, an inductor, or a thin-film resonator. The first impedance component can also comprise an inductor and a capacitor (or a thin-film resonator), which are interconnected in parallel and which form a parallel resonance circuit.

It is advantageous when the parallel resonance circuit arranged in the shunt arm has a resonance frequency that is in the pass band of the second filter.

In the first signal path, matching elements, e.g., inductors, can be provided, which can be arranged before or after the first filter. In the second signal path, matching elements, e.g., inductors, can be provided after the second filter.

The band-pass filters may have a ladder-type or (for symmetric signal guidance) lattice-type construction made from thin-film resonators. For a ladder-type filter, series resonators arranged in the signal path and also parallel resonators arranged in shunt arms are provided. The shunt arms connect the signal path to ground or connect two signal paths to each other.

The parallel resonator can be connected in the corresponding shunt arm in series with another impedance component, such as an inductor. Two different shunt arms of the same filter can be coupled to each other electrically by an additional impedance component, e.g., an inductor, a capacitor, or a line section.

In one embodiment, the thin-film resonators of the second filter and also the thin-film resonator arranged in the matching circuit are constructed on a common chip. The resonance frequency of the thin-film resonator arranged in the matching circuit may correspond to the resonance frequency of the series resonators of the second filter arranged in the second signal path.

The first impedance component can include an ESD protective element, e.g., a varistor or an inductor and can be used for discharging an overvoltage appearing on the antenna side to ground.

The first and/or the second filter can be constructed as a balanced-unbalanced transformer with an asymmetric and a symmetric gate.

In one variant, the first filter (e.g., the transmit filter) works with bulk acoustic waves and the second filter (e.g., the receive filter) works with surface acoustic waves.

Below, embodiments are explained in more detail with reference to associated figures. The figures show different embodiments with reference to schematic representations that are not true to scale. Identical parts or parts with identical functions are designated with identical reference symbols.

DETAILED DESCRIPTION

Figure 1:
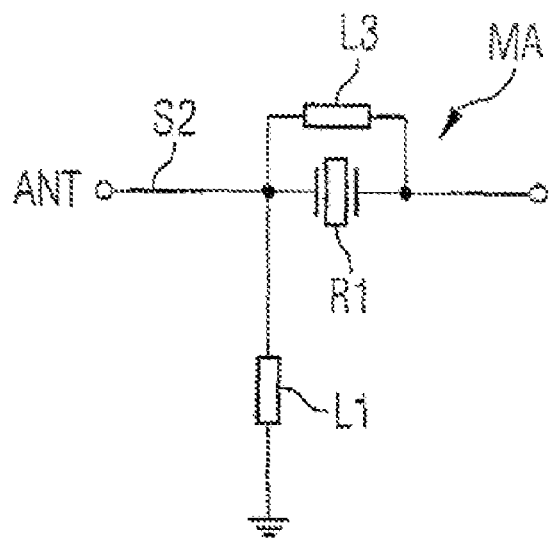
FIG. 1, an example matching circuit with a shunt arm to ground and a thin-film resonator in the second signal path.

FIG. 1 shows a matching circuit MA with a thin-film resonator R1 arranged in the second signal path S2 and a shunt arm that connects the second signal path S2 to ground. In the shunt arm there is a first impedance component, which here is an inductor L1. An inductor L3, which comprises a second impedance component, is connected in parallel relative to the thin-film resonator R1. The inductor L1 is connected in this variant directly to the antenna connection ANT. Not shown here is a first signal path, which can also be connected to the antenna ANT parallel with respect to the second signal path S2.

Figure 2:
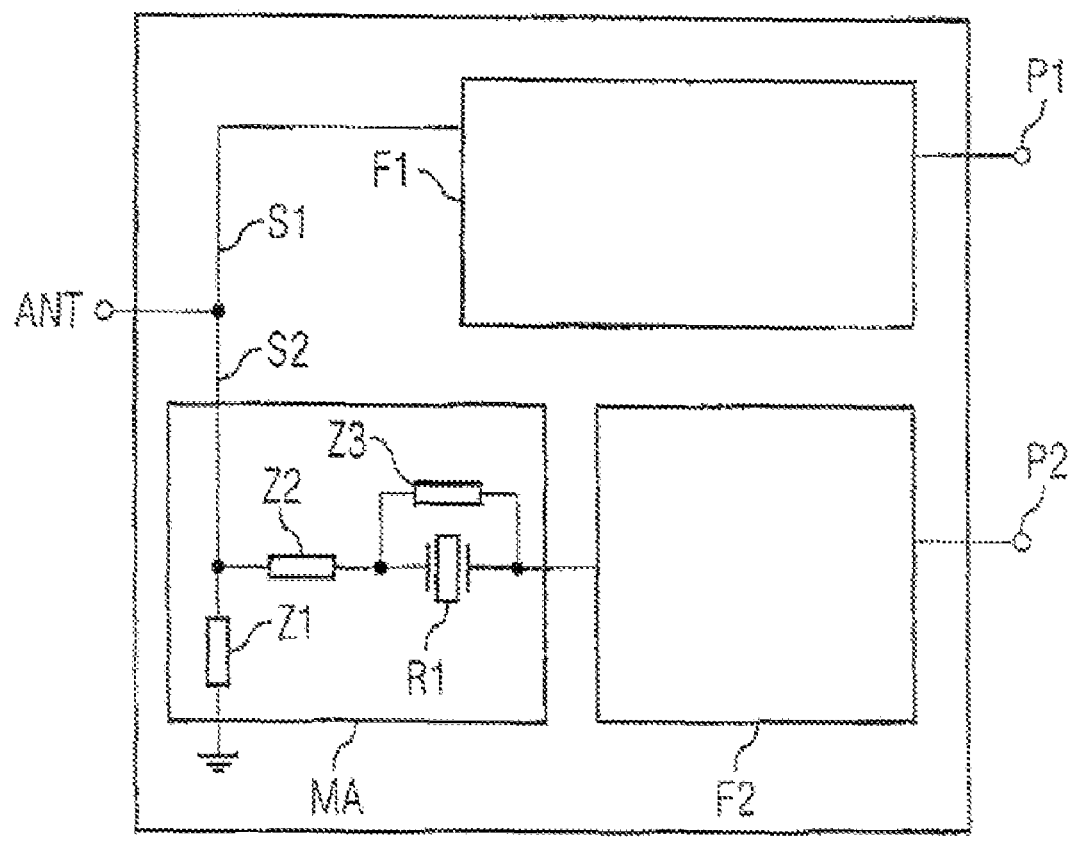
FIG. 2, a frequency separating unit with another matching circuit.

In FIG. 2, a frequency separating unit is shown, which has a first S1 and a second S2 signal path. The first signal path S1 connects the antenna terminal ANT and the first connection P1 of the frequency separating unit. The second signal path S2 connects the antenna terminal ANT and the second connection P2 of the frequency separating unit. In the first signal path S1, there is a first band-pass filter F1 and, in the second signal path S2, there is a second band-pass filter F2. The matching circuit MA is arranged in the second signal path S2 between the antenna terminal ANT and the input of the second filter F2. The matching circuit MA has a shunt arm to ground, in which the first impedance component Z1 is arranged. In the second signal path S2, the parallel circuit of a thin-film resonator R1 and a second impedance component Z3 is arranged, which is connected in series to another impedance component Z2. The impedance component Z2 is arranged between the parallel circuit and the connection node of the shunt arm.

The matching circuit MA has maximum transmission in the pass band of the second filter F2 and, e.g., maximum blockage in the pass range of the first filter F1. The impedance values of the impedance components are selected to fulfill this condition.

Figure 3:
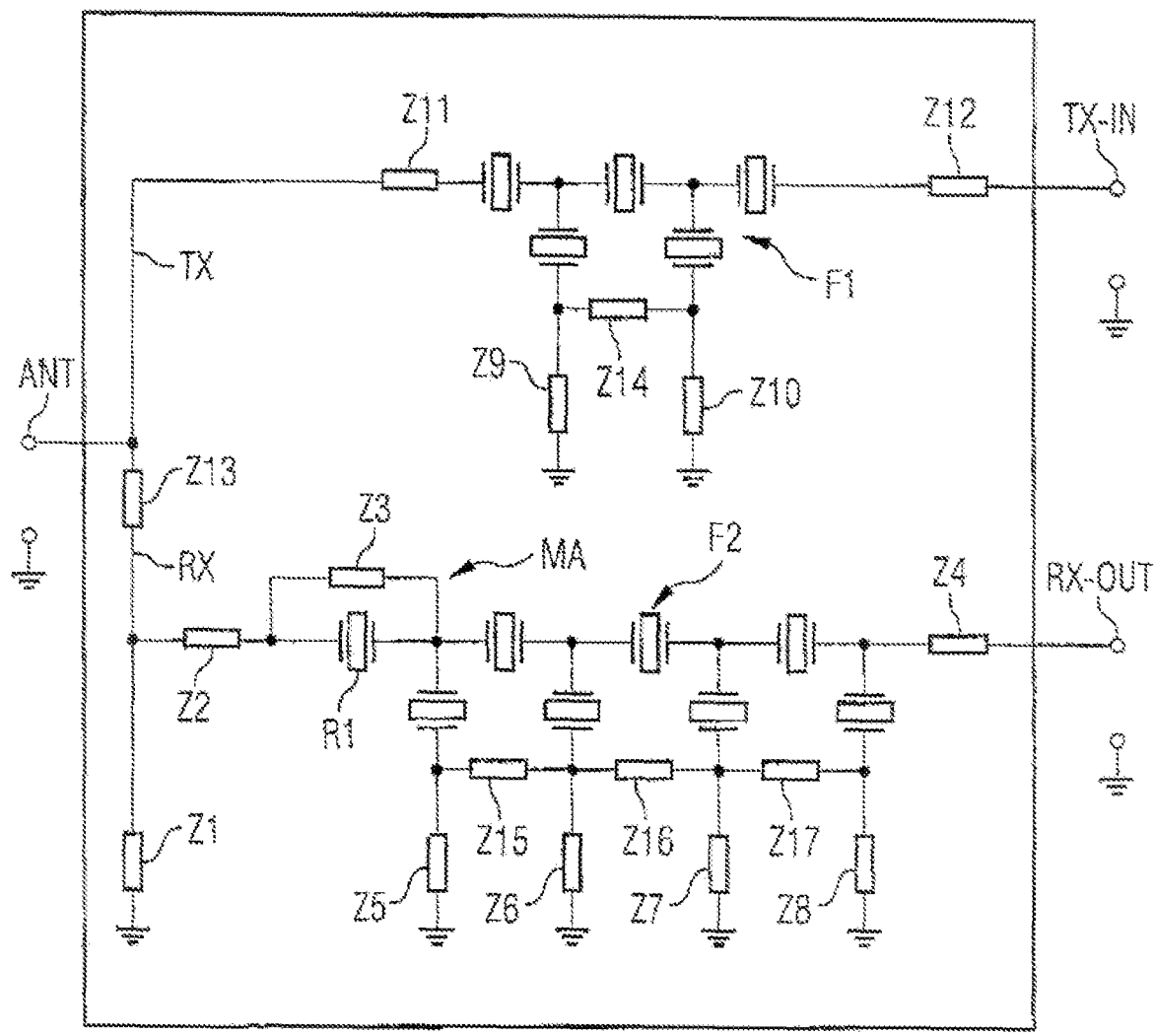
FIG. 3, a frequency separating unit with band-pass filters with a ladder-type construction and a matching circuit arranged in the second signal path on the antenna side.

In FIG. 3, a frequency separating unit is shown, which is constructed as a duplexer. The transmit path TX corresponds to the first signal path S1 and the receive path RX corresponds to the second signal path S2. The transmit path TX is connected to the transmit input TX-IN and the receive path is connected to the receive output RX-OUT.

The filters F1, F2 have a ladder-type arrangement of thin-film resonators. The resonators arranged in the signal path are series resonators and the resonators arranged in the shunt arms of the filter are parallel resonators. The parallel resonators are each connected to ground in series with an impedance component Z5, Z6, Z7, Z8, Z9, Z10. Different shunt arms are coupled to each other via the impedance components Z14, Z15, Z16, Z17. With the coupling of the parallel branches, it is possible, for example, to bring about additional poles in the transmission function of the circuit for suppressing signals outside the pass band in each signal path.

The impedance components provide an increase in the bandwidth of each band-pass filter. The impedance components Z1 to Z17 may be inductors or capacitors. The impedance components Z14, Z15, Z16, Z17 can each represent a line section.

The matching circuit MA also has, in contrast to FIG. 2, an impedance component Z13 arranged in the receive path on the antenna side. The resonance or series resonance of the series circuit of the impedance components Z13, Z2 and the resonator R1 may correspond to a pass frequency of the second filter F2. The frequency of the parallel resonance of the parallel circuit of the resonator R1 and the second impedance component Z3 may be in the pass band of the first filter F1, which improves the isolation of the two signal paths TX, RX in transmit mode.

The first filter F1 is connected in series with the impedance components Z11 and Z12, which form a matching network for the transmit path TX together with the impedance components Z9, Z10, and Z14. The second filter F2 is connected in series with an output-side impedance component Z4. The impedance components Z4 to Z8, Z15, Z16, Z17, and the matching circuit MA form a matching network for the receive path RX.

The resonator R1 may have the same layered construction and also the same resonance frequency as the resonators used in the filter F2, especially series resonators. However, it is also possible to select a different layered construction for the resonator R1 and therefore to shift its resonance frequency relative to the resonance frequency of the series resonators of the receive filter F2.

In one variant, the transmit filter F1 and the receive filter F2 are each arranged on one chip. The matching circuit may be implemented on or in the chip on which the receive filter F2 is implemented. In one embodiment, the impedance components Z1 to Z17 (especially the second impedance component Z3) are embedded in the same substrate or are arranged on this substrate on which the associated band-pass filter is implemented. It is also possible to implement the frequency separating filter completely as a chip component that may be suitable for surface mounting.

Figure 4:
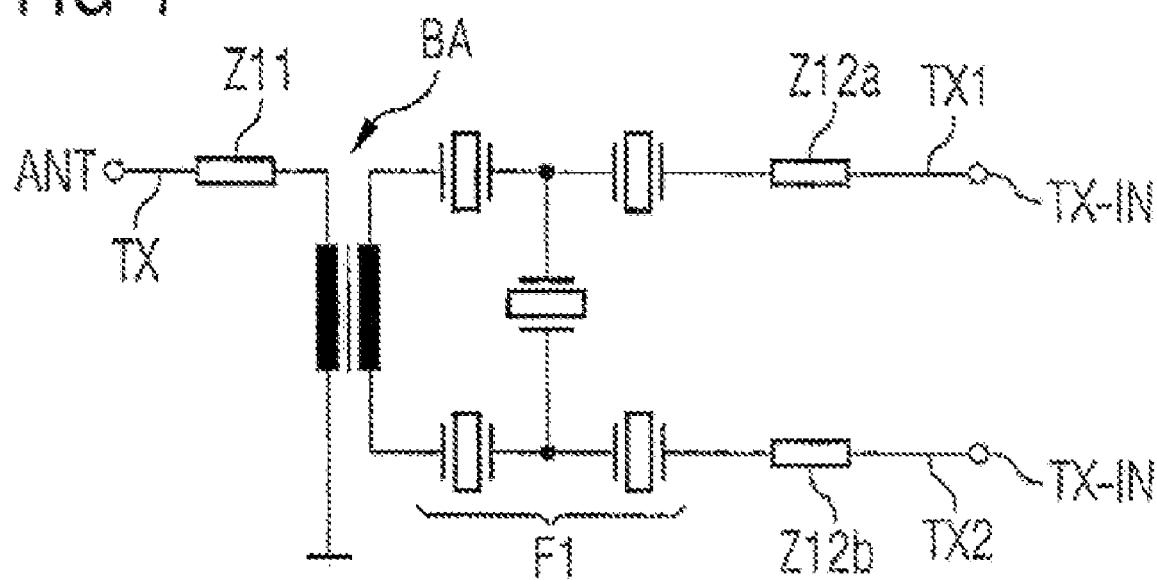
FIGS. 4, 5, each a transmit path with a balanced-unbalanced transformer realized in the path.
Figure 5:
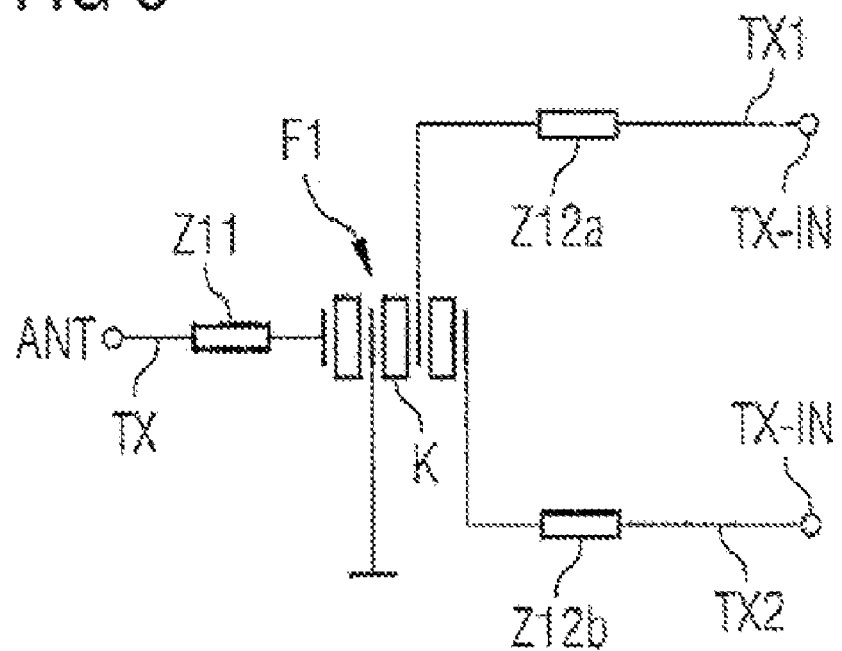

FIG. 4 shows an embodiment in which the first filter F1 is electrically symmetric (balanced) in a lattice-type structure with two series branches and at least one shunt arm connecting the series branches. Between the first filter F1 and the antenna connection, there is a balanced-unbalanced transformer BA. In the asymmetric (unbalanced) antenna-side part of the transmit path TX, there is a matching impedance Z11. The symmetric (balanced) antenna-side part of the transmit path has two signal paths TX1, TX2, each path with one matching impedance Z12a, Z12b arranged in the path.

The invention claimed is:

1. A frequency separating unit comprising:
    an antenna unit;
    a first signal path;
    a second signal path;
    a first band-pass filter in the first signal path;
    a second band-pass filter in the second signal path;
    a matching circuit between the antenna unit and the second band-pass filter in the second signal path,
    wherein the matching circuit comprises:
        a shunt arm to ground that comprises a first impedance component; and
        a parallel circuit comprising an acoustic wave resonator and a second impedance component;
    wherein the matching circuit is configured to operate as a phase shifter and to produce a substantially open circuit at an input of the second filter in a pass band of the band-pass filter.

2. The frequency separating unit of claim 1, wherein the first impedance component comprises an inductor.

3. The frequency separating unit of claim 1, wherein the first impedance component comprises a capacitor.

4. The frequency separating unit of claim 1, wherein the first impedance component comprises an acoustic wave resonator.

5. The frequency separating unit of claim 1, wherein the first impedance component comprises a parallel circuit comprised of an acoustic wave resonator and an inductor; and
   wherein a resonance frequency of the parallel circuit corresponding to a pass-band frequency of the band-pass filter.

6. The frequency separating unit of claim 1, wherein the second impedance component comprises an inductor.

7. The frequency separating unit of claim 1, wherein the second impedance component comprises a capacitor.

8. The frequency separating unit of claim 1, further comprising:
   a third impedance component in the second signal path between a connection point of the shunt arm and the parallel circuit.

9. The frequency separating unit of claim 8, wherein the third impedance component comprises an inductor or a capacitor.

10. The frequency separating unit of claim 1, further comprising:
    a fourth impedance component in the second signal path between the antenna connection and a connection point of the shunt arm.

11. The frequency separating unit of claim 10, wherein the fourth impedance component comprises an inductor or a capacitor.

12. The frequency separating unit of claim 1, wherein the first band-pass filter and/or second band-pass filter has a ladder-type structure comprised of series resonators in a signal path and parallel resonators in parallel branches; and
    wherein each parallel branch comprises an impedance component between a parallel resonator and ground.

13. The frequency separating unit of claim 12, wherein at least two different parallel branches are interconnected electrically via an impedance component.

14. The frequency separating unit of claim 1, further comprising:
    another impedance component in the first signal path before and/or after the first band-pass filter.

15. The frequency separating unit of claim 1, further comprising:
    another impedance component in the second signal path after the second filter.

16. The frequency separating unit of claim 1, wherein a resonance frequency of a circuit comprised of the matching circuit corresponds to a pass-band frequency of the second band-pass filter.

17. The frequency separating unit of claim 1, wherein the second signal path comprises a receive path and the first signal path comprises a transmit path.

18. The frequency separating unit of claim 1, wherein the first impedance component is for diverting an overvoltage appearing on the antenna unit to ground.

19. The frequency separating unit of claim 1, wherein the first band-pass filter and/or the second band-pass filter each comprises a balanced-unbalanced transformer.

20. The frequency separating unit of claim 1, wherein the acoustic wave resonator comprises a thin-film acoustic wave resonator.

21. The frequency separating unit of claim 1, wherein the acoustic wave resonator comprises at least one acoustic wave transducer.

22. The frequency separating unit of claim 17, wherein the first band-pass filter works with bulk acoustic waves and the second band-pass filter works with surface acoustic waves.

* * * * *

UNITED STATES PATENT AND TRADEMARK OFFICE
CERTIFICATE OF CORRECTION

PATENT NO. : 7,567,148 B2
APPLICATION NO. : 11/718454
DATED : July 28, 2009
INVENTOR(S) : Edgar Schmidhammer It is certified that error appears in the above-identified patent and that said Letters Patent is hereby corrected as shown below:

Cover page, Column 1, 54:
Delete "FREQUENCY SHUNT" and Insert --FREQUENCY SEPARATING UNIT--

Cover page, Column 2, Line 2 of Abstract:
Insert --a-- before "first"

First page, Column 1, Line 1:
Delete "FREQUENCY SHUNT" and Insert --FREQUENCY SEPARATING UNIT--

Column 4, Claim 1, Line 67:
Insert --first-- before "band-pass"

Column 5, Claim 5, Lines 11-12:
Delete "corresponding" and Insert --corresponds--

Column 5, Claim 5, Line 12:
Insert --second-- before "band-pass"

Column 5, Claim 12, Line 35:
Insert --the-- before "second"

Signed and Sealed this

Nineteenth Day of January, 2010

David J. Kappos
*Director of the United States Patent and Trademark Office*